United States Patent
Liu et al.

(10) Patent No.: US 9,374,103 B1
(45) Date of Patent: Jun. 21, 2016

(54) DIGITAL-TO-ANALOG CONVERTER SYSTEM

(71) Applicant: Apple Inc., Cupertino, CA (US)

(72) Inventors: Wenbo Liu, Santa Clara, CA (US); Raman S. Thiara, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/656,052

(22) Filed: Mar. 12, 2015

(51) Int. Cl.
- *H03M 1/06* (2006.01)
- *H03M 1/08* (2006.01)
- *H03K 17/16* (2006.01)
- *H03M 1/66* (2006.01)

(52) U.S. Cl.
CPC ............ *H03M 1/0854* (2013.01); *H03K 17/165* (2013.01); *H03M 1/66* (2013.01)

(58) Field of Classification Search
CPC ....... H03M 1/66; H03M 1/68; H03M 1/0617; H03M 1/682; H03M 1/765; H03M 1/687; H03M 1/808; H03M 1/667; H03M 1/0854
USPC ................................. 341/130–160
See application file for complete search history.

(56) References Cited

U.S. PATENT DOCUMENTS

| | | | | |
|---|---|---|---|---|
| 4,396,907 A * | 8/1983 | Wintzer | ................. | H03M 1/00 341/127 |
| 4,746,903 A * | 5/1988 | Czarniak | ................. | H03M 1/68 341/144 |
| 5,808,576 A | 9/1998 | Chloupek et al. | | |
| 5,838,273 A * | 11/1998 | Sauerbrey | ........... | H03M 1/0682 341/144 |
| 6,404,274 B1 * | 6/2002 | Hosono | ................. | H02M 3/073 327/536 |
| 6,646,580 B2 * | 11/2003 | Clara | ...................... | H03M 1/66 341/136 |
| 7,136,002 B2 | 11/2006 | Dempsey et al. | | |
| 7,372,387 B2 | 5/2008 | Li et al. | | |
| 7,847,716 B2 * | 12/2010 | Rivoir | ................. | H03M 7/3024 341/143 |
| 9,124,282 B1 * | 9/2015 | Gutta | ................. | H03M 1/0617 |
| 2014/0132435 A1 * | 5/2014 | Dempsey | ........... | H03M 1/0872 341/154 |

* cited by examiner

*Primary Examiner* — Lam T Mai
(74) *Attorney, Agent, or Firm* — Meyertons, Hood, Kivlin, Kowert & Goetzel, P.C.

(57) ABSTRACT

In some embodiments, a digital-to-analog converter (DAC) system includes an output segment, a main branch, first and second edge segments, and a sub-segment. The output segment includes secondary switches that selectively connect conductive paths to an output. The main branch includes unit resistance elements, each including a resistor and a switch. The first and second edge segments each include a respective group of secondary switches that selectively connect a respective conductive path to a unit resistance element. The sub-segment includes terminal resistors connected to at least one conductive path and includes main switches that selectively connect respective terminal resistors to the unit resistance element. The main switches and the unit resistance element switches use a single switch design. The DAC system may have an improved differential non-linearity (DNL), as compared to a DAC system that does not include the unit resistance element switches or the first and second edge segments.

20 Claims, 6 Drawing Sheets

DIGITAL-TO-ANALOG CONVERTER SYSTEM

BACKGROUND

1. Technical Field

This disclosure relates generally to a digital-to-analog converter system.

2. Description of the Related Art

Digital-to-analog converters (DACs) are used to convert digital signals (e.g., signals representative of digital information, typically using binary voltage levels) into analog signals that represent the converted digital information using multiple, discrete voltage intervals. One important factor that contributes to the effectiveness of a DAC is a low variation of voltage changes between output levels (low differential non-linearity (DNL)). However, in some DACs, when some switches (e.g., transistors) are part of a current path, impedance (e.g., turn-on resistance and parasitic routing resistance) due to the switches (e.g., transistors) may introduce additional non-linearity into the DAC. The additional non-linearity in the DAC may cause elevated quantization noise and, as a result, may negatively impact a signal to noise ratio (SNR) of an electronic device that includes the DAC.

One way to reduce the impedance due to a switch that is part of the current path is to increase a size of the switch. However, increasing the size of each switch of a DAC may negatively impact a size of the DAC.

SUMMARY

In various embodiments, a digital-to-analog converter (DAC) system is disclosed that includes a control signal generator, a main branch, a sub-segment, one or more edge segments, and an output segment. In some embodiments, the DAC system may include additional switches (e.g., always-on transistors) which have a common design with other switches in the DAC such that every resistance element (e.g., resistor) in the DAC corresponds to a switch. As a result, the impedance corresponding to the switches may have a decreased effect on a differential non-linearity (DNL) of the circuit. The DAC system may produce a lower differential non-linearity (DNL), as compared to a DAC that does not include the additional switches. Additionally, in some embodiments, a high-impedance load may be connected to one or more switches of the one or more edge segments. As a result, the one or more switches may not receive a significant amount of current from the DAC system and may have a decreased effect on DNL. In some embodiments, because the switches have a decreased effect on DNL of the DAC, an area of the switches may be decreased as compared to a DAC having similar DNL but does not include the additional switches or the one or more edge segments. In some embodiments, the area savings of decreasing the area of the switches may result in an area savings for the DAC (e.g., the area savings of decreasing the switches is greater than an area penalty for adding the additional switches).

Figure 1A:
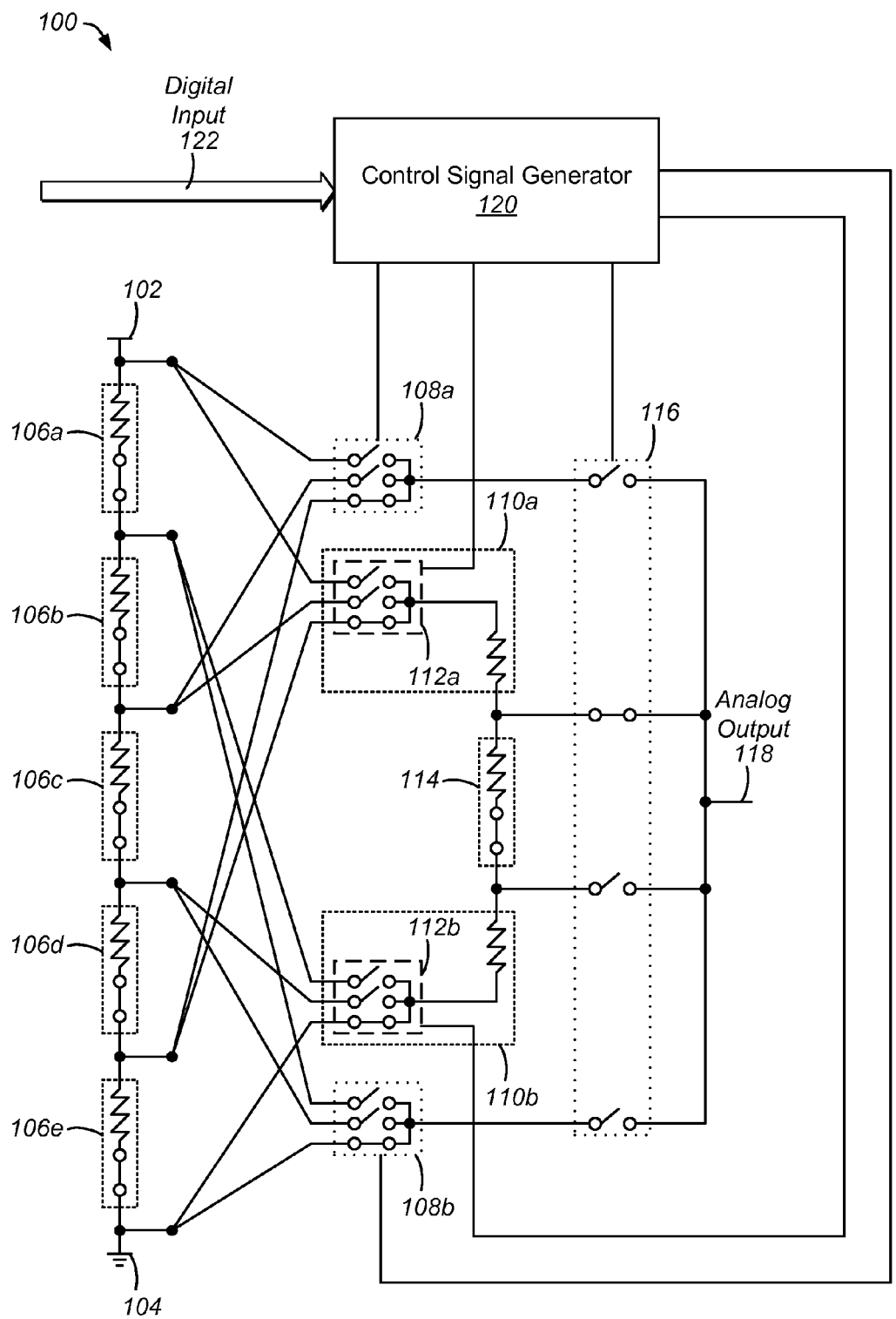
FIGS. 1A-C are block diagrams illustrating several configurations of an embodiment of an exemplary digital-to-analog converter system.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112(f), for that unit/circuit/component. Additionally, "configured to" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used herein, the term "based on" describes one or more factors that affect a determination. This term does not foreclose additional factors that may affect the determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

As used herein, the phrase "in response to" describes one or more factors that trigger an effect. This phrase does not foreclose additional factors that may affect or otherwise trigger the effect. That is, an effect may be solely in response to those factors, or may be in response to those factors as well as in response to other factors. Consider the phrase "perform A in response to B." While in this case, B is a factor that triggers the performance of A, such a phrase does not foreclose the performance of A from also being in response to C. In other instances, A may be performed solely in response to B.

DETAILED DESCRIPTION

As described above, a digital-to-analog converters (DACs) may be used to provide analog signals having discrete voltage intervals. However, the presence of switches (e.g., shunts or transistors) in a main current path of the DAC may provide additional impedance. The additional impedance may affect a variation between output levels (differential non-linearity (DNL)) in two ways. First, the additional impedance may skew a current ratio between a main path of the DAC and a sub-segment of the DAC. This skewed current ratio may cause an output voltage to be variably impacted by the additional impedance based on a configuration of the DAC (e.g., which portion of the DAC is connected to the output). Second, the additional impedance may cause a voltage drop when the switches are present between selected nodes of a main branch and the output. Accordingly, DNL of the DAC may be increased by the switches.

As will be discussed below, adding additional switches (e.g., always-on switches or other switches) and edge segments to the DAC may improve the DNL of the DAC. Some experimental results of an embodiment of a DAC system that includes additional switches and edge segments have shown a DNL reduction from 0.700 least significant bits (LSB) to 0.075 LSB, as compared to a DAC system having a similar area but that does not include the additional switches and edge segments (i.e., a DAC system that includes fewer, larger switches).

Figure 1B:
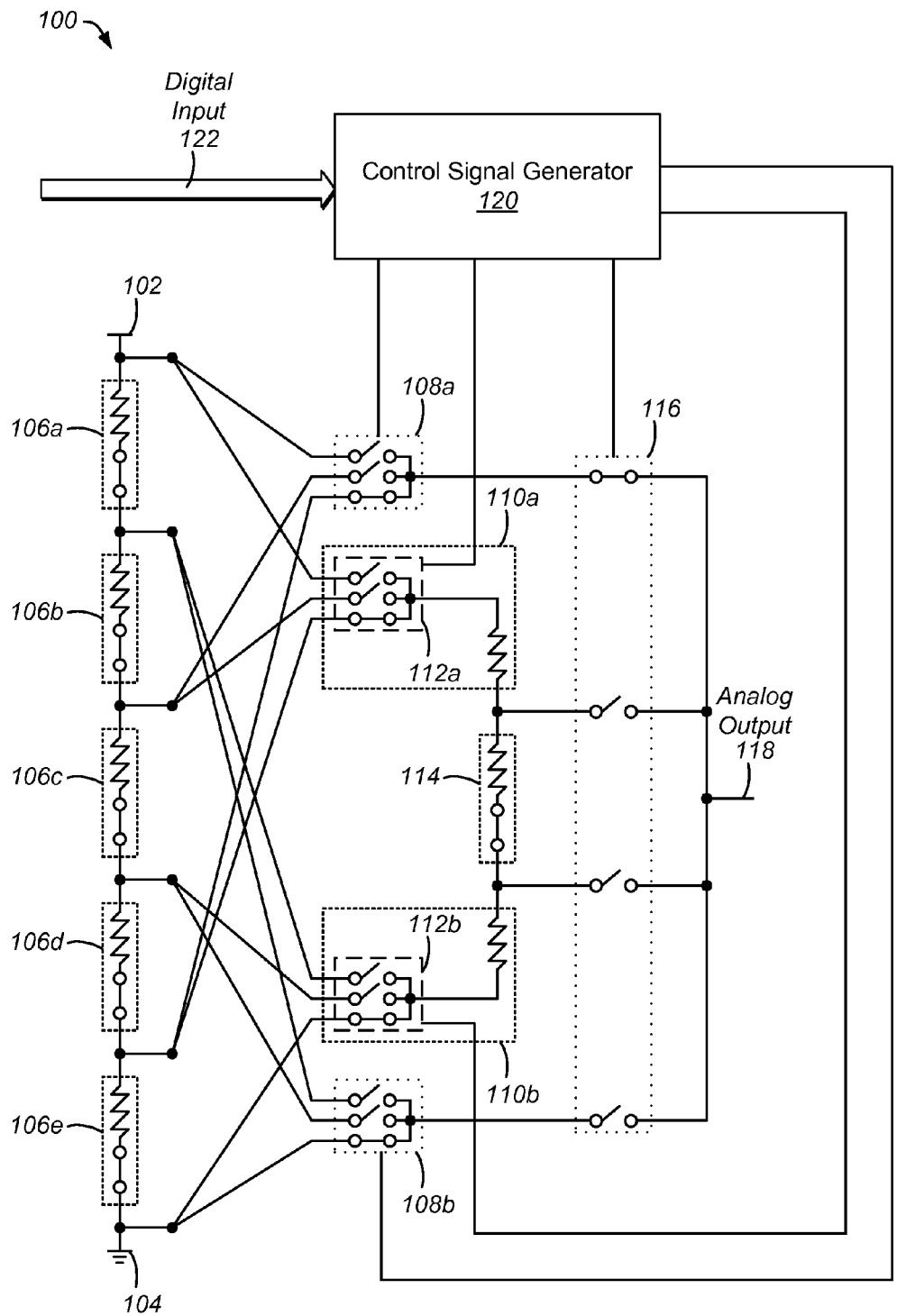
Figure 1C:
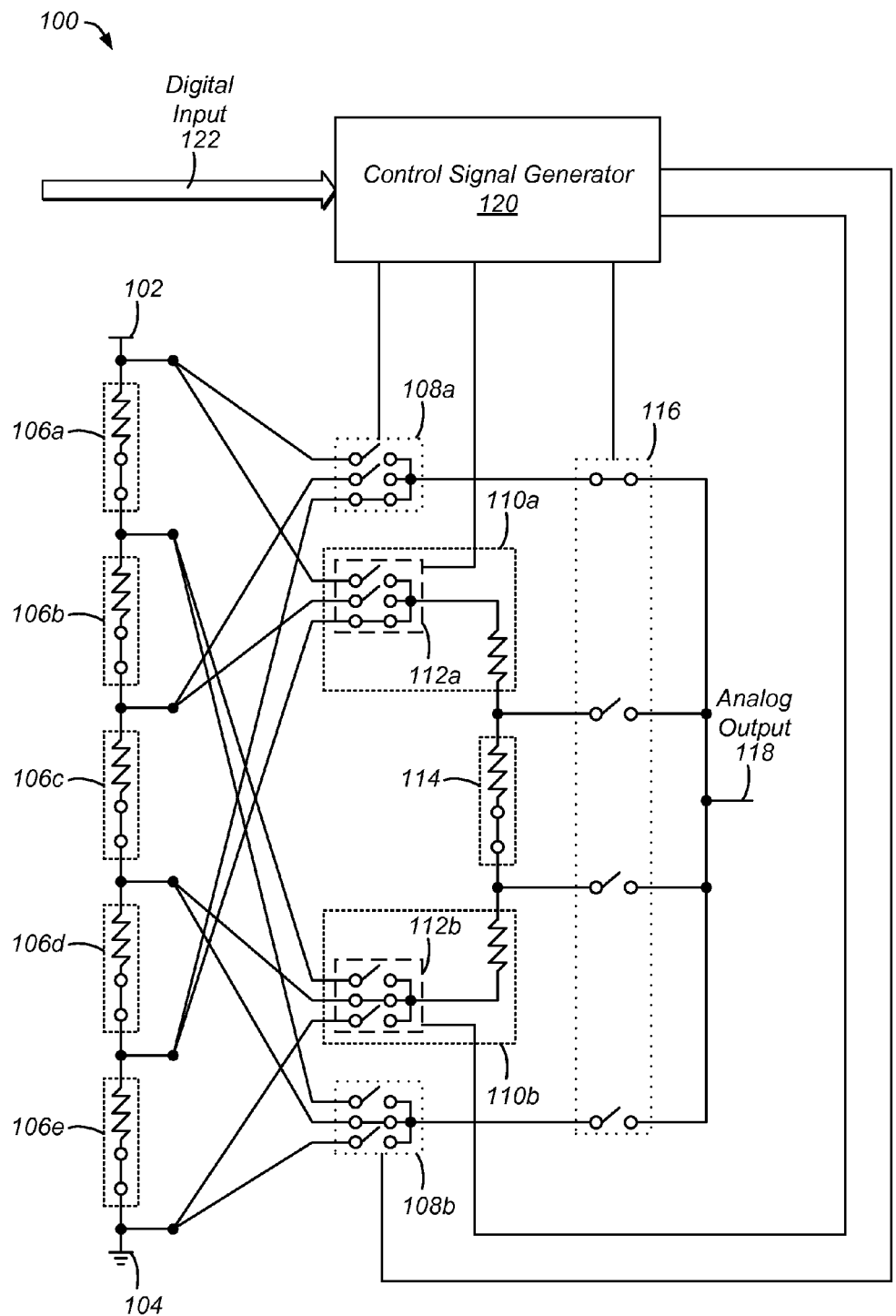

This disclosure initially describes, with reference to FIGS. 1A-C, several configurations of an embodiment of an exemplary DAC system. The techniques and structures described herein, however, are in no way limited to the DAC system shown in FIGS. 1A-C; rather, this context is provided only as one possible implementation. Embodiments of a DAC system are then described with reference to FIGS. 2 and 3. Finally, an exemplary computing system that includes a DAC system is described with reference to FIG. 4.

Turning now to FIGS. 1A-C, a block diagram of three configurations of an embodiment of an exemplary digital-to-analog converter (DAC) system 100 are shown. In the illustrated embodiment, the DAC system 100 includes a voltage source 102, a ground terminal 104, unit resistance elements 106$a$-$e$, groups of secondary switches 108$a$-$b$, sub-segment connections 110$a$-$b$, a unit resistance element 114, a group of secondary switches 116, an analog output 118, a control signal generator 120, and a digital input 122. In the illustrated embodiment, the sub-segment connections 110$a$-$b$ include respective groups of main switches 112$a$-$b$. A main branch of the DAC system 100 may include the voltage source 102, the ground terminal 104, and the unit resistance elements 106$a$-$e$. A sub-segment of the DAC system 100 may include the sub-segment connections 110$a$-$b$ and the unit resistance element 114. An output segment of the DAC system 100 may include the group of secondary switches 116 and the analog output 118. In some embodiments, each of the group of secondary switches 108$a$, the group of secondary switches 108$b$, the group of main switches 112$a$, the group of main switches 112$b$, and the group of secondary switches 116 may be one-hot (only one switch of each group may be closed at a time). In various embodiments, the voltage source 102 may be an active voltage source (e.g., a negative voltage source or a positive voltage source) or a passive ground (e.g., a chassis ground, a signal ground, or an earth ground). In various embodiments, the ground terminal 104 may be an active voltage source (e.g., a negative voltage source or a positive voltage source) or a passive ground (e.g., a chassis ground, a signal ground, or an earth ground). The ground terminal 104 may have a different voltage value than the voltage source 102.

In some embodiments, in response to the digital input 122 the DAC system 100 is configured to provide voltages at the analog output 118 at consistent, discrete voltage intervals. As further described below, the one or more control signals generated by the control signal generator 120 may select an output path (e.g., between the voltage source 102 and the analog output 118). For example, in the configuration illustrated in FIG. 1A, the one or more control signals may cause one of the switches of the group of secondary switches 108$a$, one of the switches of the group of main switches 112$a$, one of the switches of the group of main switches 112$b$, one of the switches of the group of secondary switches 108$b$, and one of the switches of the group of secondary switches 116 to be closed. In some embodiments, the switches of the unit resistance elements 106$a$-$e$ and the switch of the unit resistance element 114 may be permanently closed (e.g., "always on"). In other embodiments, the switches of the unit resistance elements 106$a$-$e$ and the switch of the unit resistance element 114 may be selectively closed based on one or more control signals (e.g., based on one or more control signals from the control signal generator 120).

Additionally, in response to the digital input 122, a voltage at the analog output 118 may be adjusted by at least an incremental amount. Adjacent, discrete voltage intervals (e.g., differing by the incremental amount) may be produced via different output paths through the DAC system 100 between the voltage source 102 and the analog output 118. For example, three such paths are illustrated by FIGS. 1A-C. In the illustrated embodiment, a voltage of $(2/4)*I*R$ may be produced at the analog output 118 in the configuration illustrated by FIG. 1A, a voltage of $(3/4)*I*R$ may be produced at the analog output 118 in the configuration illustrated by FIG. 1B, and a voltage of $(7/4)*I*R$ may be produced at the analog output 118 in the configuration illustrated by FIG. 1C.

The digital input 122 may indicate a requested analog output voltage at the analog output 118. In some embodiments, the digital input 122 may include the requested analog output voltage. In other embodiments, the digital input 122 may request an increase or a decrease in voltage (i.e., a voltage change relative to a current output voltage). The control signal generator 120 may, in response to the digital input 122, generate one or more control signals to control a current provided to one or more portions of the DAC system 100. For example, in some embodiments, the one or more control signals may cause the groups of main switches 112$a$-$b$ to form one or more current branches (at least two conductive paths between a first node and a second node). Additionally, in some embodiments, the one or more control signals may cause the groups of secondary switches 108$a$-$b$, the groups of main switches 112$a$-$b$, and the group of secondary switches 116 to select one or more output paths (a conductive path between the voltage source 102 and the analog output 118). In some embodiments, the one or more output paths may include at least a portion of the one or more current branches.

To illustrate, in the configurations of embodiments illustrated by FIGS. 1A and 1B, the unit resistance element 106$e$ and the sub-segment (the sub-segment connection 110$a$, the unit resistance element 114, and the sub-segment connection 110$b$) form a current branch. In FIGS. 1A and 1B, the unit resistance element 106$e$ connects the unit resistance element 106$d$ to the ground terminal 104. Additionally, in FIGS. 1A and 1B, the sub-segment, based on at least one control signal from the control signal generator 120, also connects the unit resistance element 106$d$ to the ground terminal 104. Alternatively, in the configuration of an embodiment illustrated by FIG. 1C, the sub-segment connects the unit resistance element 106$c$ to the unit resistance element 106$e$. Accordingly, in FIG. 1C, the unit resistance element 106$d$ and the sub-segment may form a current branch. To further illustrate, in the configuration illustrated by FIG. 1A, the group of main switches 112$a$ and the group of secondary switches 116 may select an output path. Alternatively, in the configurations illustrated by FIGS. 1B and 1C, the group of secondary switches 108$a$ and the group of secondary switches 116 may select an output path.

In various embodiments, the resistors of the sub-segment connections 110a-b (e.g., terminal resistors), the resistors of the unit resistance elements 106a-e, and the resistor of the unit resistance element 114 may, in common, use a single design (e.g., may be designed to produce equal resistance values). Accordingly, in some embodiments, the resistors of the sub-segment connections 110a-b (e.g., terminal resistors), the resistors of the unit resistance elements 106a-e, and the resistor of the unit resistance element 114 may present substantially equal resistance values (e.g., in some embodiments, on the order of 100-1000 ohms ($\Omega$)). For example, the resistors of the sub-segment connections 110a-b (e.g., terminal resistors), the resistors of the unit resistance elements 106a-e, and the resistor of the unit resistance element 114 may present equal resistance values but for parameter variation effects (e.g., on-chip variation (OCV) effects such as one or more fabrication or process variations).

Additionally, in various embodiments, the switches of the unit resistance elements 106a-e, the switch of the unit resistance element 114, and the switches of the groups of main switches 112a-b may, in common, use a single switch design (e.g., a single transistor design). Accordingly, in some embodiments, the switches of the unit resistance elements 106a-e, the switch of the unit resistance element 114, and the switches of the groups of main switches 112a-b may present substantially equal impedance values (e.g., in some embodiments, on the order of 10-100$\Omega$). For example, the switches of the unit resistance elements 106a-e, the switch of the unit resistance element 114, and the switches of the groups of main switches 112a-b may present equal impedance values but for parameter variation effects (e.g., on-chip variation (OCV) effects such as one or more fabrication or process variations). Therefore, in some embodiments, the switch of the unit resistance element 106a may have different dimensions from the switch of the unit resistance element 106b due to a fabrication variation.

Accordingly, in various embodiments, each of the unit resistance elements 106a-e, the unit resistance element 114, and the sub-segment connections 110a-b may present substantially equal resistance values (e.g., unit resistance values). In some embodiments, the switches of the unit resistance elements 106a-e and the unit resistance element 114 may more accurately match the impedance of the switches of the groups of main switches 112a-b, as compared to a DAC system that does not include the switches in the unit resistance elements 106a-e and the unit resistance element 114. As discussed above, a failure to match the impedance of the switches of groups of main switches (e.g., the groups of main switches 112a-b) may cause an unmatched voltage drop in some configurations of a DAC system, which may negatively impact the DNL of the DAC system. In other embodiments, other methods of matching the impedance of the switches of the groups of main switches may be used.

In some embodiments, to adjust one or more output voltages at the analog output 118, the DAC system 100 may be configured to form one or more current branches. Accordingly, in some embodiments, based on whether a respective unit resistance element of the unit resistance elements 106a-e is part of a current branch, the respective unit resistance element may receive a first current amount or a second current amount. Additionally, the sub-segment may receive a third current amount. An amount of current provided to an element of the DAC system 100 may be based on whether the element is part of a current branch, and, if the element is part of a current branch, an amount of resistance associated with each portion of the current branch. For example, in the configuration of an embodiment illustrated by FIG. 1A, the unit resistance element 106e and the sub-segment form a current branch. In some embodiments, the resistance provided by the unit resistance elements 106a-e, the sub-segment connections 110a-b, and the unit resistance element 114 are equal. Accordingly, in some embodiments, the sub-segment has a resistance equal to three times the size of the unit resistance element 106e. Therefore, in at least some configurations of some embodiments, the unit resistance elements 106a-d (e.g., elements not part of the current branch) receive a first current amount (e.g., I), the unit resistance element 106e receives a second current amount (e.g., (3/4)*I), and the sub-segment receives the third current amount (e.g., (1/4)*I). In some embodiments, the current amount provided to each portion of the DAC system 100 may differ. In some embodiments, the current amount is split more accurately, as compared to a DAC system where the unit resistance elements 106a-e, the unit resistance element 114, and the sub-segment connections 110a-b each present a unit resistance value, the current amount is split more accurately, as compared to a DAC system that does not include the switches in the unit resistance elements 106a-e and the unit resistance element 114. As discussed above, a failure to accurately split the current amount between a current branch (e.g., a skewed current ratio) may negatively impact the DNL of a DAC system.

In some embodiments, a high-impedance load may be connected (e.g., hard-wired or selectively connected) to the analog output 118. For example, in some embodiments, the high-impedance load may present a capacitive load or a resistance value at least 1000 times a unit resistance value presented by the unit resistance element 106a (e.g., in some embodiments, on the order of 100,000-1,000,000$\Omega$). In various embodiments, the high-impedance load may cause a current amount received at some circuit elements (e.g., the groups of secondary switches 108a-b and the group of secondary switches 116) to be much smaller than a current amount received by circuit elements which are electrically between the voltage source 102 and the ground terminal 104 (e.g., the unit resistance element 106a). The difference in current amount between the current amount received at some circuit elements and the current amount received by the circuit elements which are electrically between the voltage source 102 and the ground terminal may related to a resolution of the DAC system (e.g., at least 250 times smaller for an 8-bit resolution DAC system or at least 1000 times smaller for a 10-bit resolution DAC system). In some embodiments, because the circuit elements receive a small current amount, an effective impedance of the circuit elements may be smaller (e.g., minimal or negligible), as compared to an effective impedance associated with the groups of main switches 112a-b. Accordingly, in various embodiments, because the impedance of the circuit elements may have a small effective impedance, the circuit elements may have a small effect on the DNL of the DAC system. In other embodiments, the ratio of resistance between the unit resistance value and the high impedance load may differ.

As described above, in some embodiments, the one or more control signals may be generated by the control signal generator 120 and may be used to control the group of secondary switches 108a, the group of secondary switches 108b, the group of main switches 112a, the group of main switches 112b, the group of secondary switches 116, or any combination thereof. Controlling the group of secondary switches 108a, the group of secondary switches 108b, the group of main switches 112a, the group of main switches 112b, the group of secondary switches 116, or any combination thereof, may cause the DAC system 100 to form various configurations, such as the configurations illustrated with reference to FIGS. 1A-C. In some embodiments, the one or more control signals may be specific (e.g., unique) to one or more of the group of secondary switches 108a, the group of secondary switches 108b, the group of main switches 112a, the group of main switches 112b, the group of secondary switches 116, or any combination thereof. In other embodiments, the one or more control signals may be common to the groups of secondary switches 108a-b, the groups of main switches 112a-b, the group of secondary switches 116, or any combination thereof. For example, the one or more control signals may be common to the groups of secondary switches 108a-b, the groups of main switches 112a-b, and the group of secondary switches and may indicate (e.g., "0010") a configuration where the unit resistance element 106e is part of a current branch and the sub-segment connection 110a is directly connected to the analog output 118 via a particular switch of the group of secondary switches 116. In the example, the one or more control signals may close switches of the group of secondary switches 108a and the group of main switches 112a connected to a common node (e.g., between the unit resistance element 106d and the unit resistance element 106e). Further, in the example, the one or more control signals may close switches of the group of secondary switches 108b and the group of main switches 112b connected to another common node (e.g., between the unit resistance element 106e and the ground terminal 104). Additionally, in the example, the one or more control signals may close the particular switch of the group of secondary switches 116. In some embodiments, different control signals may indicate that different unit resistance elements of the group of unit resistance elements 106a-e are part of a current branch.

In some embodiments, fewer than all available configurations of the DAC system 100 may be used. For example, in some embodiments, the unit resistance element 106a may never be part of a current branch (e.g., because only two control bits are used to select a unit resistance element). However, in various embodiments, the connections between the voltage source 102 and the group of secondary switches 108a and between the voltage source 102 and the group of main switches 112a may be formed. Even though not all possible configurations of a switch may be used by every instance of a switch, using a uniform design may reduce a fabrication complexity associated with the group of secondary switches 108a, the group of main switches 112a, or both. Additionally, this design may cause a parasitic capacitance associated with the group of secondary switches 108a and the group of main switches 112a to more closely replicate a parasitic capacitance associated with the group of secondary switches 108b and the group of main switches 112b, respectively. Replicating the parasitic capacitances associated with the group of secondary switches 108b and the group of main switches 112b, respectively may reduce a DNL of the DAC system 100.

In some embodiments, the switches of the unit resistance elements 106a-e, the switch of the unit resistance element 114, and the switches of the groups of main switches 112a-b, the groups of secondary switches 108a-b, or any combination thereof, may be or may include one or more metal-oxide-semiconductor field-effect transistors (MOSFETs). As described above, in some embodiments, the switches of the unit resistance elements 106a-e and the switch of the unit resistance element 114 may be permanently or selectively closed. In various embodiments, the MOSFETs of the unit resistance elements 106a-e and the MOSFETs of the unit resistance element 114 may permanently or selectively operate in a triode mode (also referred to as a linear or ohmic mode, and in contrast to a cutoff mode or a saturation mode). For example, the digital input 122 may indicate a request to receive an output voltage at the analog output 118. In the example, control signal generator 120 may send one or more control signals to the switches of the unit resistance elements 106a-e and the switch of the unit resistance element 114, causing the switches of the unit resistance elements 106a-e and the switch of the unit resistance element 114 to operate in a triode mode. In some embodiments, when the MOSFETs of the unit resistance elements 106a-e and the MOSFETs of the unit resistance element 114 operate in the triode mode, OCV effects associated with one or more manufacturing variations may have a reduced effect.

In some embodiments, additional elements of the DAC system 100 may use single designs. For example, the groups of secondary switches 108a-b, the group of secondary switches 116, or any combination thereof, may, in common with the switches of the unit resistance elements 106a-e, the switch of the unit resistance element 114, and the switches of the groups of main switches 112a-b, use a single switch design (e.g., a single transistor design). In some embodiments, the single switch design may have a more complicated design (e.g., a design using multiple transistors, such as a pass gate design). In some embodiments, using the single switch design may simplify one or more design processes, one or more manufacturing processes, or both. However, because, as described above, the groups of secondary switches 108a-b, the group of secondary switches 116, or any combination thereof, may receive a small current amount, the DNL of the DAC system 100 may be improved, as compared to a DAC system where the groups of secondary switches 108a-b and the group of secondary switches 116 do not receive a small current amount.

In other embodiments, one or more components of the DAC system 100 may be external to the DAC system 100. For example, in some embodiments, the control signal generator 120 is external to the DAC system 100. Similarly, the DAC system 100 may function without one or more illustrated components. For example, in some embodiments, the control signal generator 120 may be configured to autonomously cause (e.g., based on a preprogrammed state) one or more voltages at the analog output 118 without receiving the digital input 122.

Although the illustrated DAC system 100 includes a 4-bit sliding DAC, in other embodiments, other DAC configurations may be used (e.g., another type of DAC, a DAC having fewer bits, or a DAC having more bits). For example, in another embodiment, the DAC system may include a 6-bit sliding DAC that includes seven unit resistance elements in the main branch and three unit resistance elements in the sub-segment. As another example, the DAC system may include a 3-bit sliding DAC that includes four unit resistance elements in the main branch and no unit resistance elements in the sub-segment.

Although the illustrated DAC system 100 includes respective secondary switches of the group of secondary switches 116 connected to the groups of secondary switches 108a-b, in other embodiments, the groups of secondary switches 108a-b may be directly connected to the analog output 118. In those embodiments, when at least one of the group of secondary switches 116 (e.g., connected to the sub-segment) is closed, all switches of the groups of secondary switches 108a-b may be open.

Figure 2:
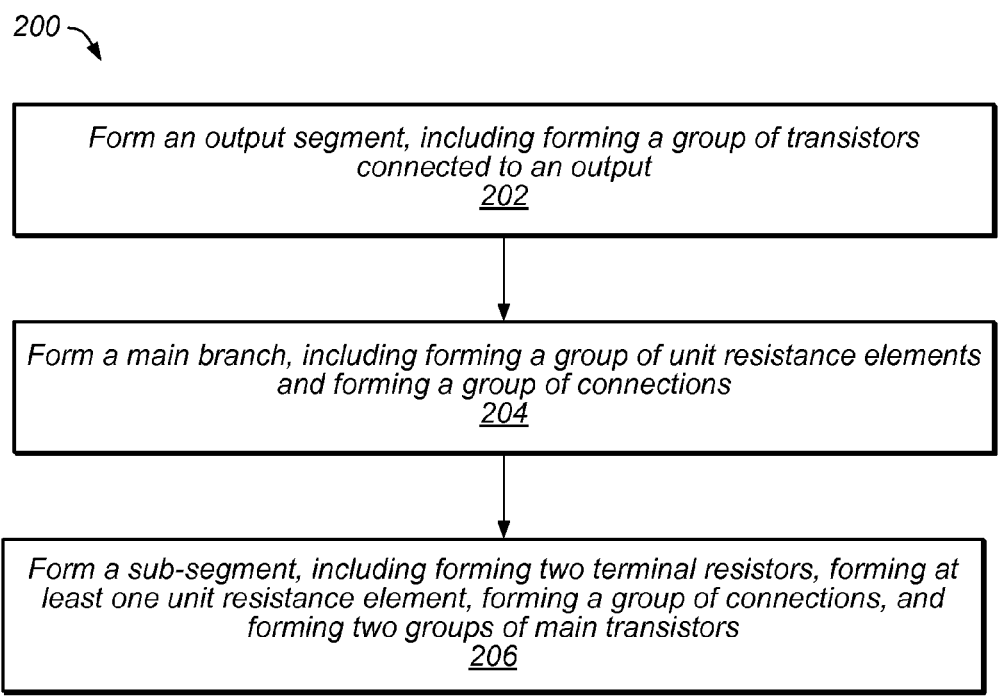
FIG. 2 is a flow diagram illustrating an embodiment of a method of manufacturing a digital-to-analog converter system.

Turning next to FIG. 2, a flow diagram of a method 200 is depicted. Method 200 is an embodiment of a method of manufacturing (e.g., fabricating) a digital-to-analog converter (DAC) system, such as the DAC system 100 of FIGS. 1A-C. For purposes of illustration, the method 200 is illustrated as being sequential. However, portions of the method 200 may be performed in other orders or in parallel (e.g., simultaneously). In some embodiments, the method 200 may be initiated or performed by one or more processors in response to one or more instructions stored by a computer-readable storage medium.

At 202, the method 200 includes forming an output segment, including forming a group of transistors connected to an output. For example, the method 200 may include forming the group of secondary switches 116 connected to the analog output 118. In some embodiments, the group of transistors are electrically positioned between a group of conductive paths and the output.

At 204, the method 200 includes forming a main branch, including forming a group of unit resistance elements and forming a group of connections (e.g., of the main branch). For example, the method 200 may include forming the group of unit resistance elements 106*a-e* and forming a group of connections between the group of unit resistance elements 106*a-e*. In various embodiments, each of the group of unit resistance elements includes a resistor and a transistor. In some embodiments, the group of connections are formed such that the group of unit resistance elements are connected in series.

At 206, the method 200 includes forming a sub-segment, including forming two terminal resistors, forming at least one unit resistance element, forming a group of connections (e.g., of the sub-segment), and forming two groups of main transistors. For example, the method 200 may include forming the resistors (e.g., terminal resistors) of the sub-segment connections 110*a-b*, forming the unit resistance element 114, forming a group of connections between the resistors of the sub-segment connections 110*a-b* and the one unit resistance element 114, and forming the groups of main switches 112*a-b*. In various embodiments, the at least one unit resistance element includes a resistor and a transistor. In some embodiments, the group of connections are formed such that two terminal resistors and the at least one unit resistance element are connected in series. The at least one unit resistance element may be electrically positioned between the two terminal resistors. The group of connections may be connected to respective conductive paths of the group of conductive paths. In some embodiments, forming a first group of main transistors includes electrically positioning the first group of main transistors between a first of the two terminal resistors and at least two respective connections of the group of connections of the main branch. In some embodiments, forming a second group of main transistors includes electrically positioning the second group of main transistors between a second of the two terminal resistors and at least two respective connections of the group of connections of the main branch.

In some embodiments, a single transistor design is used in common for the respective transistors of the group of unit resistance elements, the respective transistors of the at least one unit resistance element, the first group of main transistors, and the second group of main transistors. For example, a single transistor design may be used in common for the each of the switches of the group of unit resistance elements 106*a-e*, for the switches of the unit resistance element 114, and for each of the switches of the groups of main switches 112*a-b*.

In some embodiments, the method 200 also includes fabricating a silicon-based system-on-a-chip (SoC). Fabricating the silicon-based SoC may include forming the output segment, forming the main branch, forming the first edge segment, forming the second edge segment, forming the sub-segment, or any combination thereof. Accordingly, the silicon-based SoC may include one or more portions of the DAC system formed by the method 200. In some embodiments, fabricating the silicon-based SoC also includes forming one or more processor cores, forming a memory controller, forming a memory device, forming an external interface, forming an interconnect, or any combination thereof.

In some embodiments, the method 200 also includes forming a clock signal recovery circuit, into which the DAC system is integrated. For example, the clock signal recovery circuit may be configured to provide a digital input, such as the digital input 122 and to receive an analog output such as the analog output 118.

Figure 3:
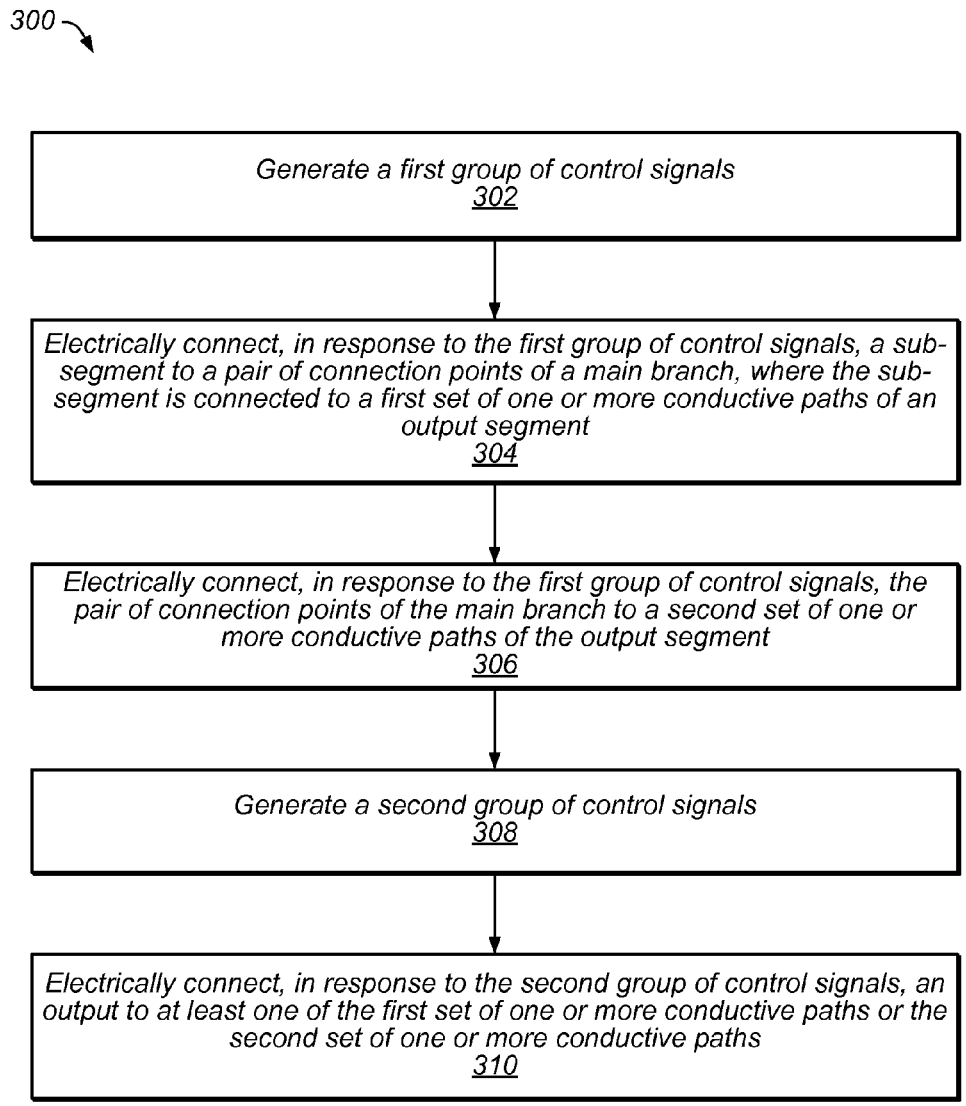
FIG. 3 is a flow diagram illustrating an embodiment of a method of operating a digital-to-analog converter system.

Turning next to FIG. 3, a flow diagram of a method 300 is depicted. Method 300 is an embodiment of a method of operating a digital-to-analog converter (DAC) system, such as the DAC system 100 of FIGS. 1A-C. For purposes of illustration, the method 300 is illustrated as being sequential. However, portions of the method 300 may be performed in other orders or in parallel (e.g., simultaneously). In some embodiments, the method 300 may be initiated or performed by one or more processors in response to one or more instructions stored by a computer-readable storage medium.

At 302, the method 300 includes generating a first group of control signals. For example, the method 300 may include generating, by the control signal generator 120, a first group of control signals. In some embodiments, the first group of control signals are sent to a group of main switches of a sub-segment and sent to one or more secondary switches of one or more edge segments.

At 304, the method 300 includes electrically connecting, in response to the first group of control signals, a sub-segment to a pair of connection points of a main branch, where the sub-segment is connected to a first set of one or more conductive paths of an output segment. For example, the method 300 may include electrically connecting, by the groups of main switches 112*a-b* in response to a first group of control signals from the control signal generator 120, a sub-segment to a pair of connection points of a main branch, where the sub-segment is connected to a first set of one or more conductive paths (e.g., paths which are connected to respective switches of the group of secondary switches 116) of an output segment. In some embodiments, the pair of connection points are connected to one another by a unit resistance element of the main branch. The unit resistance element may include a resistor and a switch. A single switch design may be used in common for the group of main switches and the switch of the unit resistance element.

At 306, the method 300 includes electrically connecting, in response to the first group of control signals, the pair of connection points of the main branch to a second set of one or more conductive paths of the output segment. For example, the method 300 may include electrically connecting, by the groups of secondary switches 108*a-b* (e.g., secondary switches of the one or more edge segments) in response to the first group of control signals from the control signal generator 120, the pair of connection points of the main branch to a second set of conductive paths (e.g., paths which are connected to respective switches of the group of secondary switches 116) of the output segment.

At 308, the method 300 includes generating a second group of control signals. For example, the method 300 may include generating, by the control signal generator 120, a second group of control signals. In some embodiments, the second group of control signals are provided to one or more secondary switches of the output segment.

At 310, the method 300 includes electrically connecting, in response to the second group of control signals, an output to at least one of the first set of one or more conductive paths or the second set of one or more conductive paths. For example, the method 300 may include electrically connecting, by the group of secondary switches 116 (e.g., secondary switches of the output segment) in response to the second group of control signals, an output voltage (e.g., an analog output voltage) to at least one of the first set of one or more conductive paths or the second set of one or more conductive paths.

Figure 4:
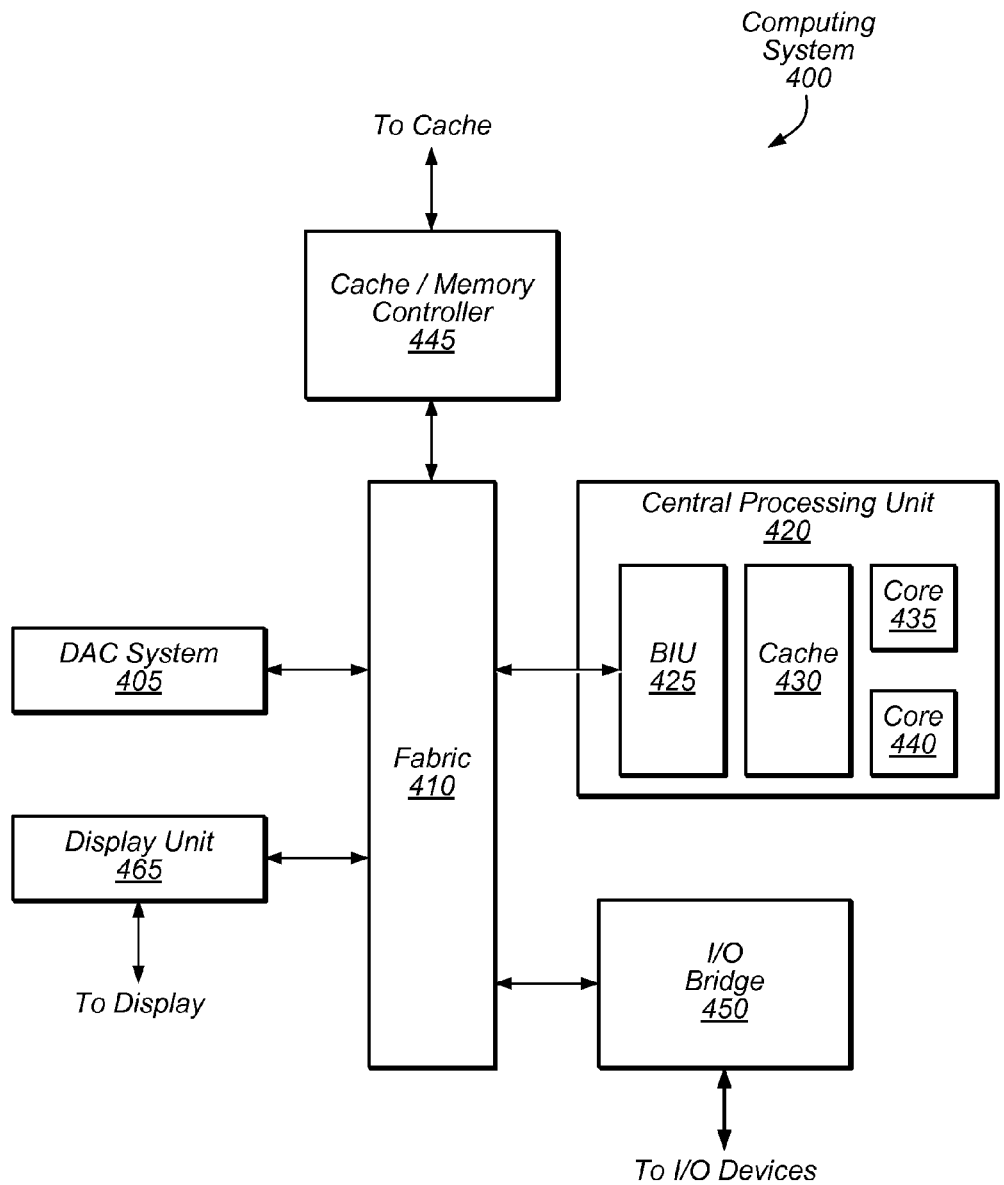
FIG. 4 is a block diagram illustrating an embodiment of an exemplary computing system that includes a digital-to-analog converter system.

Turning next to FIG. 4, a block diagram illustrating an exemplary embodiment of a computing system 400 is shown. Computing system 400 is an embodiment of a computing system that includes a digital-to-analog (DAC) system 405. In some embodiments, the DAC system 405 corresponds to the DAC system 100 described above with reference to FIGS. 1A-C, including any variations or modifications described previously with reference to FIGS. 1A-3. In some embodiments, some or all elements of the computing system 400 may be included within a system on a chip (SoC) (e.g., a SoC described above with reference to FIG. 2). In some embodiments, some or all elements of the computing system 400 may constitute or form a clock signal recovery circuit. In some embodiments, computing system 400 is included in a mobile device. Accordingly, in at least some embodiments, area and signal-to-noise ratio (SNR) of the computing system 400 may be important design considerations. In the illustrated embodiment, computing system 400 includes fabric 410, central processing unit (CPU) complex 420, input/output (I/O) bridge 450, cache/memory controller 445, DAC system 405, and display unit 465. Although the computing system 400 illustrates the DAC system 405 as being connected to the fabric 410, in other embodiments, the DAC system 405 may be connected to or included in other components of the computing system 400. Additionally or alternatively, the computing system 400 may include multiple DAC systems 405. The multiple DAC systems 405 may correspond to different embodiments or to the same embodiment.

Fabric 410 may include various interconnects, buses, MUX's, controllers, etc., and may be configured to facilitate communication between various elements of computing system 400. In some embodiments, portions of fabric 410 are configured to implement various different communication protocols. In other embodiments, fabric 410 implements a single communication protocol and elements coupled to fabric 410 may convert from the single communication protocol to other communication protocols internally.

In the illustrated embodiment, CPU complex 420 includes bus interface unit (BIU) 425, cache 430, and cores 435 and 440. In various embodiments, CPU complex 420 includes various numbers of cores and/or caches. For example, CPU complex 420 may include 1, 2, or 4 processor cores, or any other suitable number. In an embodiment, cache 430 is a set associative L2 cache. In some embodiments, cores 435 and/or 440 include internal instruction and/or data caches. In some embodiments, a coherency unit (not shown) in fabric 410, cache 430, or elsewhere in computing system 400 is configured to maintain coherency between various caches of computing system 400. BIU 425 may be configured to manage communication between CPU complex 420 and other elements of computing system 400. Processor cores such as cores 435 and 440 may be configured to execute instructions of a particular instruction set architecture (ISA), which may include operating system instructions and user application instructions.

Cache/memory controller 445 may be configured to manage transfer of data between fabric 410 and one or more caches and/or memories (e.g., non-transitory computer readable mediums). For example, cache/memory controller 445 may be coupled to an L3 cache, which may, in turn, be coupled to a system memory. In other embodiments, cache/memory controller 445 is directly coupled to a memory. In some embodiments, the cache/memory controller 445 includes one or more internal caches. In some embodiments, the cache/memory controller 445 may include or be coupled to one or more caches and/or memories that include instructions that, when executed by one or more processors (e.g., CPU complex 420 and/or one or more cores 435, 440 of the CPU complex 420), cause the processor, processors, or cores to initiate or perform some or all of the processes described above with reference to FIG. 2. In some embodiments, the cache/memory controller 445 may include or be coupled to one or more caches and/or memories that include instructions that, when executed by one or more processors (e.g., CPU complex 420 and/or one or more cores 435, 440 of the CPU 420), cause the processor, processors, or cores to initiate or perform some or all of the processes described above with reference to FIG. 3.

As used herein, the term "coupled to" may indicate one or more connections between elements, and a coupling may include intervening elements. For example, in FIG. 4, display unit 465 may be described as "coupled to" the DAC system 405 through fabric 410. In contrast, in the illustrated embodiment of FIG. 4, display unit 465 is "directly coupled" to fabric 410 because there are no intervening elements.

Display unit 465 may be configured to read data from a frame buffer and provide a stream of pixel values for display. Display unit 465 may be configured as a display pipeline in some embodiments. Additionally, display unit 465 may be configured to blend multiple frames to produce an output frame. Further, display unit 465 may include one or more interfaces (e.g., MIPI® or embedded display port (eDP)) for coupling to a user display (e.g., a touchscreen or an external display).

I/O bridge 450 may include various elements configured to implement: universal serial bus (USB) communications, security, audio, and/or low-power always-on functionality, for example. I/O bridge 450 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 400 via I/O bridge 450. In some embodiments, the DAC system 405 may be coupled to the computing system 400 via the I/O bridge 450.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
an output segment comprising a first plurality of secondary switches configured to selectively connect a plurality of conductive paths to an output;
a main branch comprising a plurality of unit resistance elements, wherein each of the plurality of unit resistance elements comprises a respective resistor and a respective switch;
a first edge segment comprising a second plurality of secondary switches configured to selectively connect at least one conductive path of the plurality of conductive paths to at least one unit resistance element of the plurality of unit resistance elements;
a second edge segment comprising a third plurality of secondary switches configured to selectively connect at least one conductive path of the plurality of conductive paths to at least one unit resistance element of the plurality of unit resistance elements; and
a sub-segment comprising:
a plurality of terminal resistors, wherein at least one of the plurality of conductive paths is connected to at least one of the plurality of terminal resistors; and
a plurality of main switches configured to selectively connect at least one terminal resistor to at least one unit resistance element of the plurality of unit resistance elements,
wherein a single switch design is used in common for the plurality of main switches and the respective switches of the plurality of unit resistance elements.

2. The apparatus of claim 1, wherein the sub-segment further comprises at least one unit resistance element comprising a respective resistor and a respective switch.

3. The apparatus of claim 2, wherein the at least one unit resistance element connects at least two terminal resistors of the plurality of terminal resistors.

4. The apparatus of claim 2, wherein a single design is used in common for the at least one unit resistance element and the plurality of unit resistance elements.

5. The apparatus of claim 1, wherein a single design is used in common for the plurality of unit resistance elements and the plurality of terminal resistors.

6. The apparatus of claim 1, wherein the output is configured to connect the output segment, the first edge segment, the second edge segment, at least one of the plurality of terminal resistors, or any combination thereof, to a high impedance load.

7. The apparatus of claim 1, wherein the single switch design is used for the first plurality of secondary switches.

8. The apparatus of claim 1, wherein the single switch design is used for the second plurality of secondary switches and for the third plurality of secondary switches.

9. A method, comprising:
generating, by a control signal generator, a first group of control signals for a plurality of main switches of a sub-segment and for one or more secondary switches of one or more edge segments;
electrically connecting, by the plurality of main switches in response to the first group of control signals, the sub-segment to a pair of connection points of a main branch, wherein the pair of connection points are connected by a unit resistance element of the main branch, wherein the unit resistance element includes a resistor and a switch, wherein a single switch design is used in common for the plurality of main switches and the switch of the unit resistance element, and wherein the sub-segment is connected to a first set of one or more conductive paths of an output segment;
electrically connecting, by the one or more secondary switches of the one or more edge segments in response to the first group of control signals, the pair of connection points of the main branch to a second set of one or more conductive paths of the output segment;
generating, by the control signal generator, a second group of control signals for one or more secondary switches of the output segment; and
electrically connecting, by the one or more secondary switches of the output segment in response to the second group of control signals, an output to at least one of the first set of one or more conductive paths or the second set of one or more conductive paths.

10. The method of claim 9, wherein the output segment, the main branch, the one or more edge segments, the sub-segment, or any combination thereof, is integrated in a silicon-based system-on-a-chip (SoC).

11. The method of claim 10, wherein the silicon-based SoC includes one or more processor cores, a memory controller, a memory device, an external interface, an interconnect, or any combination thereof.

12. The method of claim 9, wherein the switch of the unit resistance element has different dimensions from at least one switch of the plurality of main switches due to a fabrication variation.

13. The method of claim 9, wherein the sub-segment includes at least two terminal resistors, and wherein electrically connecting the output to the first set of one or more conductive paths comprises electrically connecting the output to the pair of connection points of the main branch via respective terminal resistors of the at least two terminal resistors and respective main switches of the at least two of the plurality of main switches.

14. A system, comprising:
a processing unit configured to generate one or more control signals; and
a digital-to-analog converter (DAC), comprising:
a main branch comprising a plurality of unit resistance elements connected in series, wherein connections of the plurality of unit resistance elements form a plurality of connection points of the main branch, and wherein each of the plurality of unit resistance elements comprises a respective resistor and a respective switch;
a sub-segment comprising:
a first terminal resistor;
a second terminal resistor;
at least one unit resistance element comprising a respective resistor and a respective switch, wherein the first terminal resistor, the second terminal resistor, and the at least one unit resistance element are connected in series, and wherein connections of the first terminal resistor, the second terminal resistor, and the at least one unit resistance element form a plurality of connection points of the sub-segment;
a first plurality of main switches configured to, responsive to the one or more control signals from the processing unit, selectively connect the first terminal resistor to two or more of the plurality of connection points of the main branch; and
a second plurality of main switches configured to, responsive to the one or more control signals from the processing unit, selectively connect the second terminal resistor to two or more of the plurality of connection points of the main branch, wherein a single switch design is used in common for the respective switches of the plurality of unit resistance elements, the respective switches of the at least one unit resistance element, the first plurality of main switches, and the second plurality of main switches; and an output segment comprising:

a first plurality of secondary switches configured to, responsive to the one or more control signals from the processing unit, selectively connect an output to at least one of the plurality of connection points of the main branch; and a second plurality of secondary switches configured to, responsive to the one or more control signals from the processing unit, selectively connect the output to at least one of the plurality of connection points of the sub-segment.

15. The system of claim 14, wherein the DAC further comprises:

a third plurality of secondary switches configured to, responsive to the one or more control signals from the processing unit, selectively connect the first plurality of secondary switches to two or more of the plurality of connection points of the main path.

16. The system of claim 14, further comprising a clock signal recovery circuit, wherein the clock signal recovery circuit includes the DAC.

17. The system of claim 14, wherein responsive to the one or more control signals, the DAC is configured to adjust an output voltage at the output by an incremental amount.

18. The system of claim 14, wherein the respective switches of the plurality of unit resistance elements comprise metal-oxide-semiconductor field-effect transistors (MOSFETs).

19. The system of claim 18, wherein the MOSFETs of the plurality of unit resistance elements are permanently configured to operate in a triode mode.

20. The system of claim 18, wherein the processing unit is configured to provide, responsive to an indication of a request to receive an output voltage at the output of the DAC, a plurality of control signals to the MOSFETs, wherein the plurality of control signals are configured to cause the MOSFETs of the plurality of unit resistance elements to operate in a triode mode.

* * * * *